US010429922B2

(12) United States Patent
Binard

(10) Patent No.: US 10,429,922 B2
(45) Date of Patent: Oct. 1, 2019

(54) POWER DOMAIN HAVING AN IMPLEMENTATION OF AN ON-CHIP VOLTAGE REGULATOR DEVICE

(71) Applicant: SEMICONDUCTOR COMPONENTS INDUSTRIES, LLC, Phoenix, AZ (US)

(72) Inventor: Christian Binard, Brussels (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/911,894

(22) Filed: Mar. 5, 2018

(65) Prior Publication Data

US 2019/0272023 A1     Sep. 5, 2019

(51) Int. Cl.
```
G05F 1/46       (2006.01)
G06F 1/3296     (2019.01)
G06F 1/30       (2006.01)
H01L 27/06      (2006.01)
H01L 21/8252    (2006.01)
H02M 3/158      (2006.01)
```
(52) U.S. Cl.
CPC ............ *G06F 1/3296* (2013.01); *G05F 1/465* (2013.01); *G06F 1/305* (2013.01); *H01L 21/8252* (2013.01); *H01L 27/0605* (2013.01); *H02M 3/1584* (2013.01)

(58) Field of Classification Search
CPC ... G06F 1/3296; G06F 1/305; H01L 27/0605; H01L 21/8252; H02M 3/1584; H02M 7/003; G05F 1/465

USPC ......................................................... 363/147
See application file for complete search history.

(56) References Cited

U.S. PATENT DOCUMENTS 6,107,689 A *  8/2000  Kozono ................... H01L 23/13
                                                   257/737
2011/0304052 A1* 12/2011 Turner ................. G06F 17/5077
                                                   257/773

(Continued)

OTHER PUBLICATIONS

Shin'ichiro Mutoh, et al., "1-V Power Supply High-Speed Digital Circuit Technology with Multithreshold-Voltage CMOS," IEEE J. of Solid-State Circuits, Aug. 8, 1995, 847-854, vol. 30, No. 8.

(Continued)

*Primary Examiner* — Alex Torres-Rivera
(74) *Attorney, Agent, or Firm* — Adam R. Stephenson, Ltd.

(57) ABSTRACT

Implementations of on-chip electrical regulation devices may include: a positive power domain electrically coupled with a negative power domain through a power mesh including two or more loads. The positive power domain, negative power domain, or both the positive power domain and negative power domain may each include a power domain rail. The power domain rail may include a resistance distributed along a length of the power domain rail. The distributed resistance may be electrically coupled with one or more transistors also distributed along the power domain rail. Each of the one or more transistors, in combination with the distributed resistance, may be configured to dissipate electrical power along the length of the power domain rail to reduce a voltage across the positive power domain, negative power domain, or both the positive power domain and the negative power domain to a desired operating voltage at the power mesh.

11 Claims, 5 Drawing Sheets

(56) References Cited

U.S. PATENT DOCUMENTS

| | | | | |
|---|---|---|---|---|
| 2012/0242149 A1* | 9/2012 | Chuang | ............... | G06F 17/5063 307/42 |
| 2012/0286135 A1* | 11/2012 | Gong | ........................ | G05F 1/56 250/200 |
| 2013/0057335 A1* | 3/2013 | Kawai | ........................ | G05F 1/56 327/537 |
| 2013/0249616 A1* | 9/2013 | Priel | .............. | H03K 19/018507 327/319 |

OTHER PUBLICATIONS

Selçuk Köse and Eby G. Friedman, "Distributed On-Chip Power Delivery," IEEE J. on Emerging and Selected Topics in Circuits and Systems, Dec. 2012, 704-713, vol. 2, No. 4.

Suming Lai, et al., "Stability Assurance and Design Optimization of Large Power Delivery Networks with Multiple On-chip Voltage Regulators," IEEE/ACM International Conference on Computer-Aided Design, Nov. 5-8, 2012, San Jose, California.

Selçuk Köse, "Thermal Implications of On-Chip Voltage Regulation: Upcoming Challenges and Possible Solutions," DAC '14 Proceedings of the 51st Annual Design Automation Conference, Jun. 6, 2014, New York, NY.

\* cited by examiner

22 ↘

POWER DOMAIN HAVING AN IMPLEMENTATION OF AN ON-CHIP VOLTAGE REGULATOR DEVICE

BACKGROUND

1. Technical Field

Aspects of this document relate generally to electrical regulation systems, including those used for integrated circuits. More specific implementations involve on-chip voltage bias systems for integrated circuits (ICs).

2. Background

Conventionally, integrating down-converting voltage regulators dissipate on-chip power equal to the current load multiplied by the difference of its supply minus its output voltage. The external supply and ground are delivered at punctual places in the integrated circuit (IC) floorplan, including bond pads. The power is carried to the IC blocks by a metal track network creating an impedance which generates voltage drops.

SUMMARY

Implementations of on-chip electrical regulation systems may include: a positive power domain electrically coupled with a negative power domain through a power mesh including two or more loads. The positive power domain, the negative power domain, or both the positive power domain and the negative power domain may each include a power domain rail. The power domain rail may include a resistance distributed along a length of the power domain rail. The distributed resistance may be electrically coupled with one or more transistors also distributed along the length of the power domain rail. Each of the one or more transistors, in combination with the distributed resistance, may be configured to dissipate electrical power along the length of the power domain rail to reduce a voltage across the positive power domain, the negative power domain, or both the positive power domain and the negative power domain to a desired operating voltage at the power mesh.

Implementations of on-chip electrical regulation systems may include one, all, or any of the following:

The power mesh may include a plurality of metal tracks electrically coupled with the two or more loads.

The positive power domain, the negative power domain, or both the positive power domain and the negative power domain may include a single trace.

The one or more transistors may be connected in a source follower configuration or an emitter follower configuration.

The two or more loads may be transistors, digital gates, analog circuits, or any combination thereof.

A gate voltage or base voltage of each of the one or more transistors may be used in reducing the voltage received by each transistor from the power domain rail to the desired operating voltage.

The one or more transistors, in combination with the distributed resistance, may be configured to generate using open loop control a substantially constant voltage drop across each of the two or more loads of the power mesh across the length of the power domain rail.

Implementations of on-chip electrical regulation systems may include a positive power domain electrically coupled with a negative power domain through a power mesh including two or more loads. The positive power domain, the negative power domain, or both the positive power domain and the negative power domain may include a power domain rail. The power domain rail may include a resistance distributed along a length of the power domain rail. The distributed resistance may be electrically coupled with one or more transistors also distributed along the length of the power domain rail. The one or more transistors, in combination with the distributed resistance, may be configured to provide an equipotential voltage to the power mesh across the length of the power domain rail.

Implementations of on-chip electrical regulation systems may include one, all, or any of the following:

The power mesh may include a plurality of metal tracks electrically coupled with the two or more loads.

The positive power domain, negative power domain, or both the positive power domain and the negative power domain may include a single trace.

The one or more transistors may be connected in a source follower configuration or an emitter follower configuration.

The two or more loads may be transistors, digital gates, analog circuits or any combination thereof.

A gate voltage or a base voltage of each of the one or more transistors may be used in reducing a voltage received by each transistor from the power domain rail to the equipotential voltage.

The one or more transistors, in combination with the distributed resistance, may be configured to generate using open loop control a substantially constant voltage drop across each of the two or more loads of the power mesh across the length of the power domain rail.

Implementations of on-chip electrical regulation systems may include: a positive power domain electrically coupled with a negative power domain through a power mesh including two or more loads. The positive power domain, negative power domain, or both the positive power domain and the negative power domain may include a power domain rail. The power domain rail may include a distributed resistance distributed along a length of the power domain rail. The distributed resistance may be electrically coupled with one or more transistors also distributed along the length of the power domain rail. The one or more transistors, in combination with the distributed resistance, may be configured to generate, using open loop control, a substantially constant voltage drop across the two or more loads of the power mesh across the length of the power domain rail.

Implementations of on-chip electrical regulation systems may include one, all, or any of the following:

The one or more transistors may be connected in a source follower configuration or an emitter follower configuration.

The positive power domain, the negative power domain, or both the positive power domain and the negative power domain may include a single trace.

A gate voltage or a base voltage of each of the one or more transistors may be used in reducing a voltage received by each transistor from the power domain rail to the desired operating voltage.

The two or more loads may be transistors, digital gates, analog circuits, or any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended on-chip voltage regulators and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such on-chip voltage regulators, and implementing components and methods, consistent with the intended operation and methods.

Figure 1:
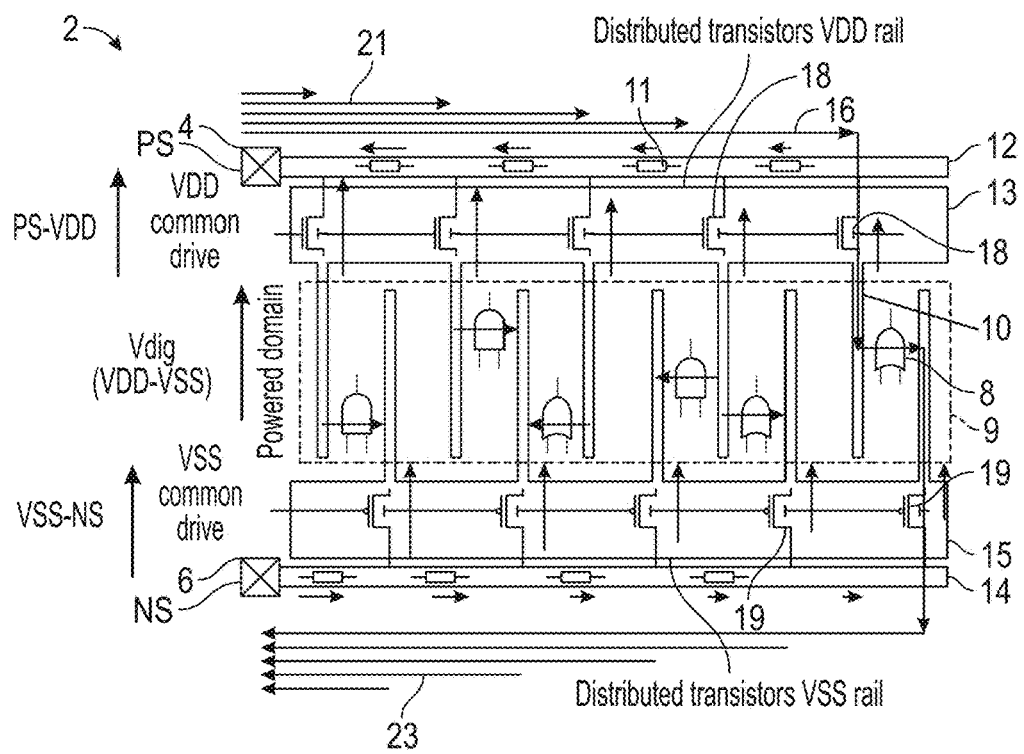
FIG. 1 is a plan view of an implementation of a power domain having an implementation of an on-chip voltage regulator device.

Referring to FIG. 1, an implementation of a power supply system 2 is illustrated. In this implementation, the particular power supply system is an on-chip regulator (voltage regulator/regulation system). The concepts described in this document for this on-chip regulator also may be applied to other power supply systems. Also, while the examples in this document discuss regulating voltages, the principles can also be applied to regulating currents and regulating both currents and voltages. As illustrated, this implementation includes a positive powering 4 powering domain. In the implementation illustrated, the positive power domain 4 is electrically coupled with a negative powering domain 6 through a powered domain 9. A positive power supply pin PS is coupled to the positive powering domain 4 and a negative power supply pin NS is coupled to the negative powering domain 6. In the implementation illustrated in FIG. 1, the positive powering domain 4 is positioned parallel to the negative power supply (NS) 6 powering domain. However, in other implementations, the positive powering domain 4 and negative powering domain 6 may be only positioned substantially parallel with each other or not parallel at all.

Figure 9:
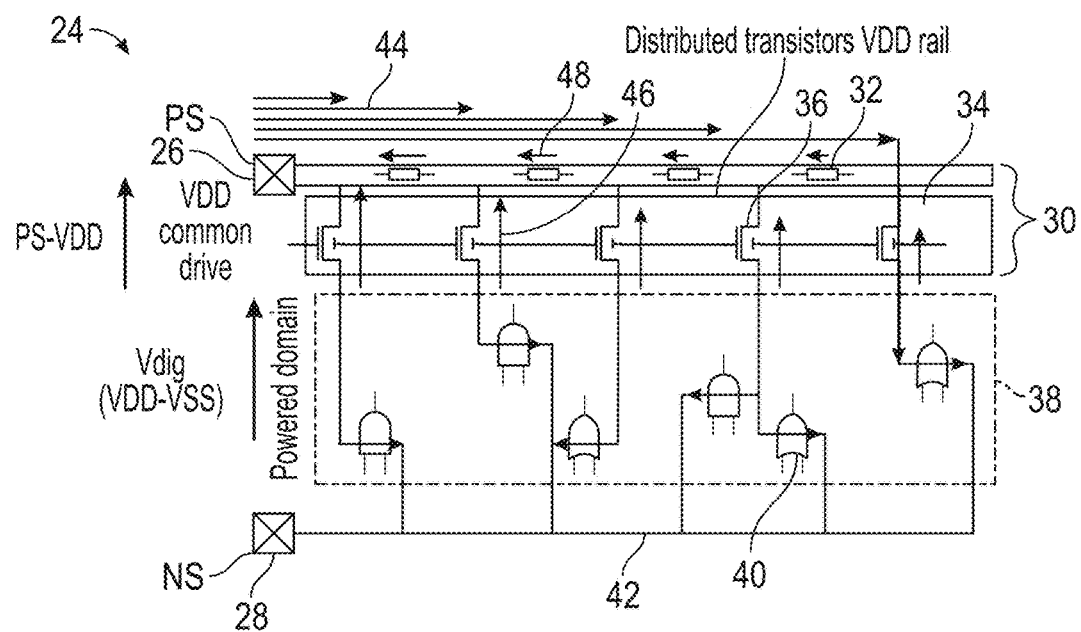
FIG. 9 is a plan view of another implementation of a power domain having an implementation of an on-chip voltage regulator device.

In various implementations, the positive powering domain 4 may include a power domain rail 13 (positive power domain rail in this case) coupled with the positive power supply pin. Likewise, the negative powering domain 6 may include a power domain rail 15 (negative power domain rail in this case) coupled with the negative power supply pin. However, in various implementations, either the positive powering domain 4 or the negative powering domain 6 may not include a power domain rail but may simply include an electrical trace carrying power from the corresponding power supply pin to the powered domain 9. This allows various system implementations to include just one power domain rail rather than two (the design in FIG. 9 illustrates this concept with only a positive power rail). As illustrated in FIG. 1, implementations of power domain rails 13 and 15 may include a distributed resistance depicted as a plurality of rail segment resistors 12 and 14 arranged down the length of the power domain rail (like resistor 11). Accordingly, in this document, when the power domain rail of FIG. 1 is referred to, the components of rail segment resistors 12 and 14 are included with those structures illustrated as elements 13 and 15 of the power domain rails. The use of the two sets of reference numerals is merely done for the purposes of illustration. Also in various implementations, a plurality of transistors (indicated by transistors 18, 19 and the Distributed transistors VDD rail/Distributed transistors VSS rail designations in FIG. 1) may be included in implementations of power domain rails 13, 15. While in FIG. 1 a plurality of transistors are illustrated in power domain rails 13, 15, in particular implementations, a single large transistor could be used instead. These transistors may be any type of transistor, including by non-limiting example, metal oxide field effect transistors (MOSFETs), bipolar junction transistors (BJTs), and any other transistor type capable of regulating voltage and/or current. Where the transistors are bipolar transistors in various implementations, references to gate voltages in this document are equivalent to references to base voltages; references to source voltages in this document are equivalent to references to emitter voltages.

The powered domain 9 is positioned between the power domain rails 13, 15 and electrically couples them together. As illustrated, in various implementations, the powered domain 9 may be a plurality of metal tracks 10 arranged in an interdigitated fashion between a plurality of electrical loads 8. However, in other implementations, electrical conductors other than metallic conductors could be used, such as, by non-limiting example, graphene, electrically conductive polymers, semiconductor materials, and any other electrically conductive material (including for the power domain rails 13, 15). In other implementations, however, no metal tracks 10 may be used, but rather electrical traces between the power domain rail 13, the loads 8, and the power domain rail 15 may be employed. Two or more loads may be included in the powered domain 9 and arranged physically on the chip surface as desired by the circuit designer.

During operation of the system of FIG. 1, the system is designed to provide a regulated desired/required operating voltage to the loads 10 of the powered domain 9. The structure of the systems disclosed herein performs this regulation in an open loop fashion, not requiring the use of any closed loop control circuitry to ensure that the desired operating voltage is created and consistently supplied. This is accomplished through the use source follower NMOS transistors of the positive power domain rails 13 and source follower PMOS transistors of the negative power domain 15. Since all source followers have equal gate voltage, "VDD common drive" in 13 and "VSS common drive" in 15, the powered domain VSS and VDD biases are uniformly defined at powered domain boundaries. Under uniform load assumption over the powered domain, each track 10 collects the same related load 8 current. That current comes from the local transistor 18 and power rail 12 represented by current flow arrow 16. The powering rail 12 delivers multiple currents flowing from the pin PS to the plurality of transistors and tracks. As a result, the further away from the PS pin, the less current is flowing in the powering rail and the lower is the drop on the resistors representing the rail segment impedance as illustrated by the lines varying in length pointing to the left under line 16 in FIG. 1. All the rail segment resistors are in series so the drop from the PS pin to the transistor drains increases when going to the right. Because the voltage at each transistor's source is same and equal to VDD, the transistors' drain-source voltage decreases from left to right as depicted by the arrows in 13. The complementary behavior happens at the VSS side towards the NS pin. The effect of each transistor/resistor combination creating a voltage drop along the length of the power domain rail 13 is that power is dissipated by each transistor/resistor combination. This has the effect of dissipating the power required to drop the voltage from the voltage of the positive power supply to the operating voltage of the loads 10 in the powered domain 9 across the length of the power domain rail 13. As will be illustrated, this has the effect of spreading the heating effect caused by the power dissipation along the length of the power domain rail 13. Likewise, because the power dissipation and voltage drop (and corresponding current control) are all set using a statically set gate voltage on each transistor, the designer can know exactly what voltage will be supplied to the load(s) in the powered domain 9 without having to check, verify, and correct the voltage as in ordinary voltage regulator circuits. This system therefore illustrates the open loop nature of operation of the voltage regulation systems disclosed herein.

In some implementations, as illustrated in FIG. 1, a current may flow into the device from the positive power supply, into the power domain rail 13, through resistor 11, through transistor 18, into a metal track 10 in the powered domain 9, through electrical load 8, through transistor 19 of power domain rail 15, through a resistor of powering rail 14, and out to the negative power supply pin NS. In this way, two power domain rails are used to regulate the voltage and current experienced by the loads in the powered domain 9connected to the positive power supply and the negative power supply. However, in other implementations, either the power domain rail coupled to the positive power supply or the negative power supply coupled to the negative power supply may be omitted, meaning that powered domain voltage regulation activity is governed only using one rail. As previously described, (and as illustrated in FIG. 9), the other power domain rail is replaced with a trace equivalent to a powering rail 14 or 12 of low impedance. In the implementation illustrated in FIG. 1, digital gates are illustrated as the loads 8. In other implementations, the loads 8 could be transistors, field, effect transistors, resistors or any type of electrical load device and combinations thereof including analog circuitry.

Referring to FIG. 9, another system implementation 24 is illustrated. In this implementation, only a positive powering domain 30 is included which contains a plurality of rail segment resistors 32 electrically coupled with a plurality of transistors 36. This allows the system implementation 24 to drop the voltage from the voltage of the positive power supply received at pin PS/26 to a desired operating voltage for the loads 40 in the powered domain 38. As illustrated, the powered domain negative power supply is connected to the negative power supply pin NS/28 using a simple trace 42. The width/thickness of trace 42 may be varied in various implementations in order to carry the desired current with tolerable voltage drop (i.e., in some implementations it can be a "thick" trace). As previously illustrated, the loads 40 are digital gates in this implementations but may be different components, including any disclosed in this document.

While a one to one ratio of rail segment resistors to transistors in the power domain rails has been illustrated thus far, in various implementations any combination resistors to a single transistor/group of transistors or transistors to a single resistor/group of resistors could be used in various implementations to create the desired current and/or voltage to be supplied to the powered domain. Accordingly, the versions illustrated in the drawings are for the illustrative purposes of this disclosure only.

Figure 2:
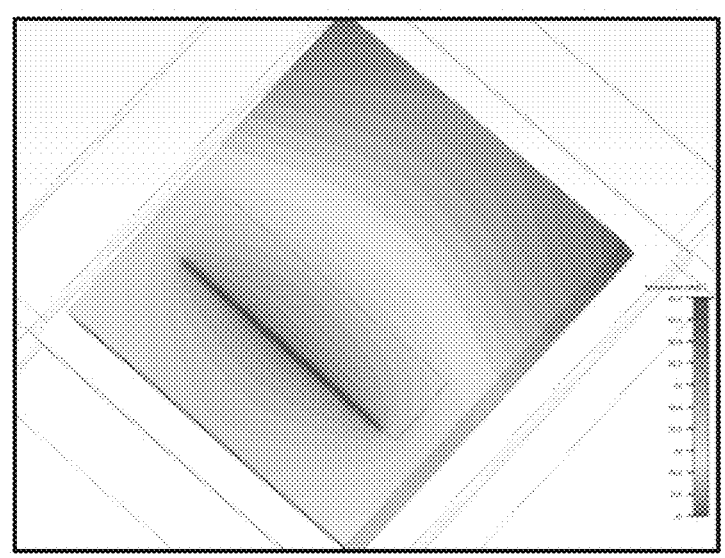
FIG. 2 is a thermal simulation of a chip having an implementation of an on-chip VDD voltage regulator device as illustrated in FIG. 9.
Figure 3:
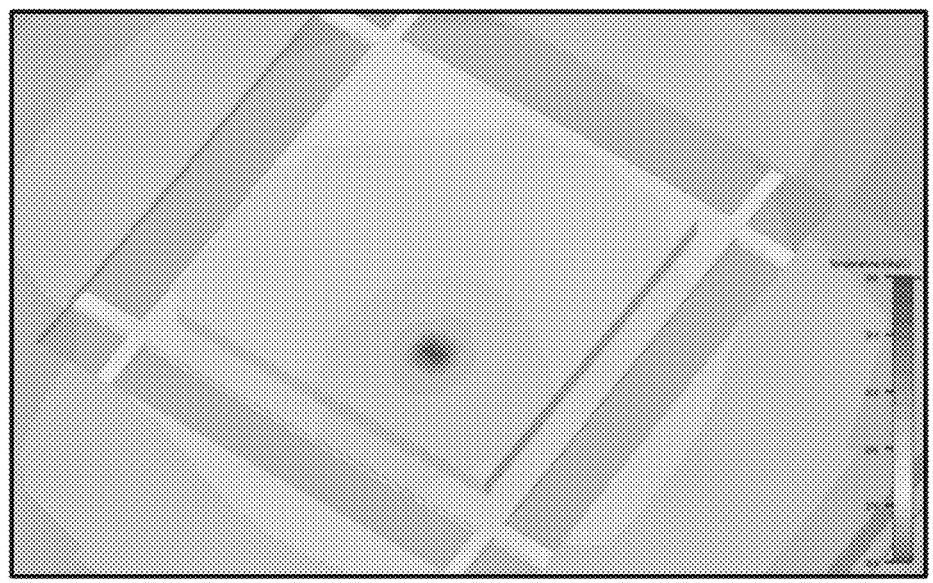
FIG. 3 is a thermal simulation of a chip having a conventional on-chip voltage regulator with same power dissipation as in FIG. 2.

Referring to FIG. 2, a simulated thermal gradient of an implementation of an on-chip voltage regulator 20 like those disclosed in FIG. 9 operating in an electronic device is illustrated. For an implementation of a voltage regulator system like that in FIG. 1 the thermal simulation would be similar but with two dissipation temperature stripes along the dimensions of the chip. In this implementation, the device includes a distributed digital power supply and a classical ground trace. This drawing represents a simulation of the heat that would be produced by an implementation of an on-chip regulator 20. The temperature generated by the transistors in this implementation of an on-chip regulator 20 is distributed across a greater area (the length of the power domain rail corresponding with the line shaped area of the powered digital block). The implementation of the on-chip regulator 20 eliminates the point-shaped hot spot created by conventional on-chip regulators 22 illustrated in FIG. 3. In so doing, on-chip regulators like those disclosed herein may improve the reliability and thermal performance of electronic devices. As illustrated by the simulation image in FIG. 2, system implementations like those disclosed herein also makes the thermal gradient one dimensional rather than two dimensional. In FIG. 2, the temperature range across the chip is as low as 7 C. In contrast, the conventional regulator 22 illustrated in FIG. 3 has a temperature range of 137 C, making the integrated circuit potentially inoperable. The existence of the much wider temperature range in devices, such as that in FIG. 3, can cause many issues in integrated circuit operation like fast wear out or thermal mismatch between transistors and packaging materials due to the thermal gradient during operation because of different thermal expansion coefficients between materials in the die with materials in the package, and so forth. If the temperature range/gradient were just 7 C, the effects of thermal mismatch issues would be quite minimal, and could reduce the cost and complexity of various packaging designs without requiring development of lower thermal resistance packages (which have increased cost). All of this can be enabled by spreading the power dissipation along the length of the power domain rail rather than dissipating the power in a conventional power regulation circuit.

Figure 4:
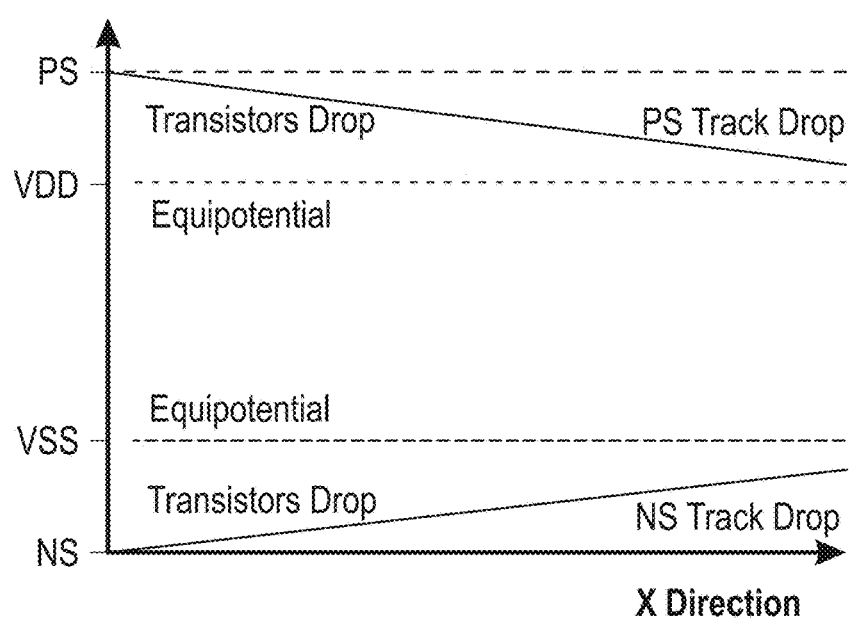
FIG. 4 is a graph showing voltages in a powering domain as described herein.

Referring to the graph illustrated in FIG. 4, the voltage of the system down the length of the power domain rails 13, 15 in the X direction of the system illustrated in FIG. 1 is illustrated. As illustrated, the resistors and transistors in each powering rail and power domain rail drop the voltage from the power supply voltage PS to VDD and maintain the voltage at VDD and VSS across the length of the powered domain, establishing an equipotential at the desired operating voltage across the entire powered domain while dissipating the needed power to drop the voltage across the length of the power domain rails. This behavior of the system allows for the thermal performance improvements previously mentioned and allows the designer to arrange loads in the powered domain area without having to use separate voltage regulators or switching circuitry.

Figure 5:
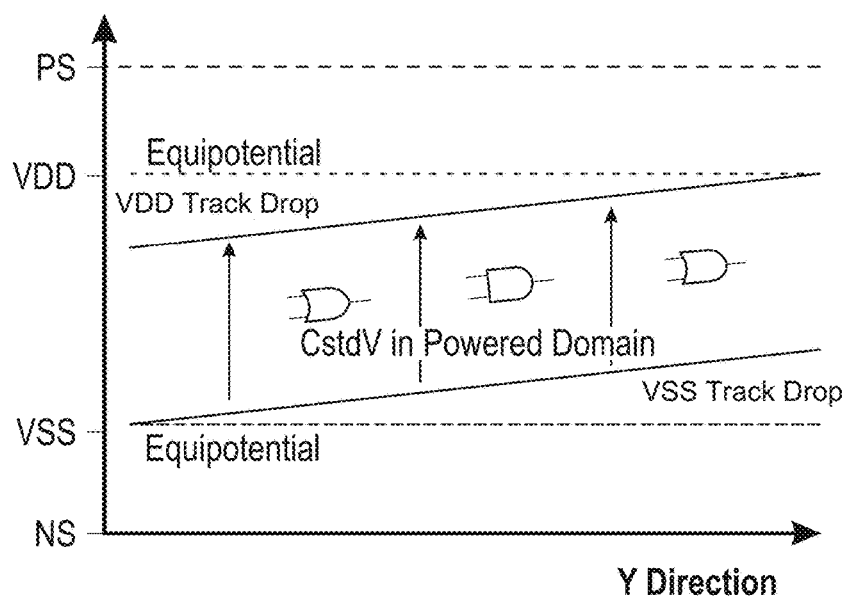
FIG. 5 is a graph showing voltages in a powered domain as described herein.

Referring to FIG. 5, another graph of voltage in the powering domains is illustrated over the Y direction. As can be observed, the voltage in the powered domain ranges between the equipotential level on the VSS side to the equipotential point for the VDD side. In the Y-direction of the powered domain a voltage drop due to the load current flow into the FIG. 1 resistive tracks 10 is observed. Along the Y direction, the drops are differently shared between the VDD and VSS tracks. The sum of the drops is constant, so the electrical load differential voltage is constant with limited common mode shift in the Y direction. This condition can be described as a constant delta voltage in the powered domain (CstdV) and a monotonic common mode trend. As illustrated in FIG. 5, the common mode voltage trend is even linear in case of uniform load density. Also, because of the equipotential, if the loads are all the same types of devices (such a logic gates), this system design permits all the gates to operate at the same speed (be as fast) as every other gate in the powered domain without requiring the use of switching or other control circuitry.

In various implementations, it may be possible to create parallel equipotential powering domain rails with an orthogonally arranged power mesh between the two powering domain rails. In this way, devices and other electrical loads can be located in an organized way around the supply and reference rails.

Figure 6:
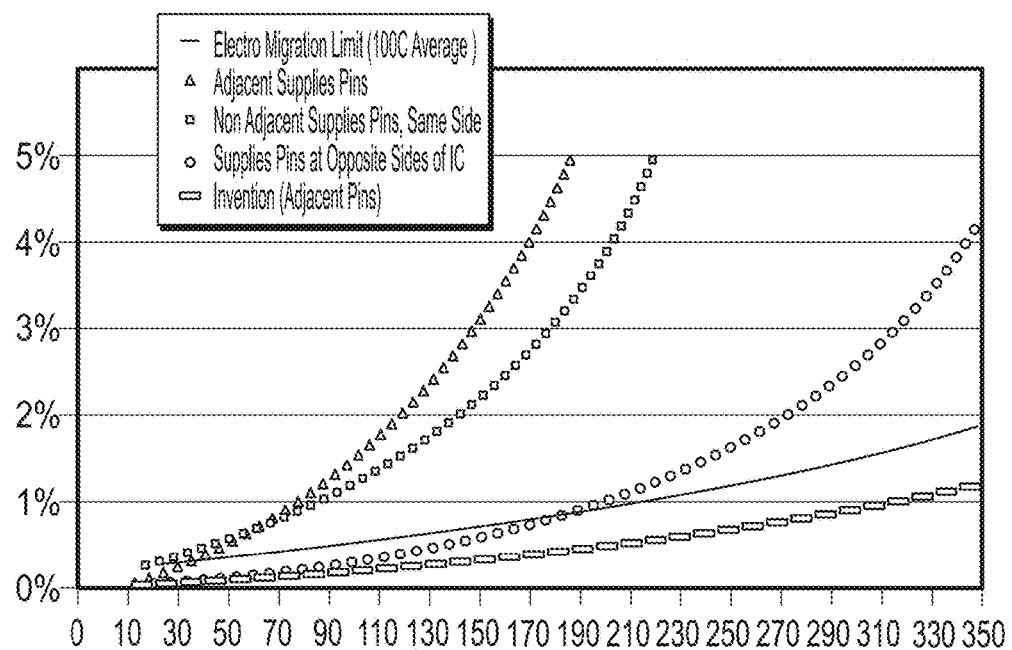
FIG. 6 is a graph showing a power metallization area at a frequency of 20 MHz.
Figure 7:
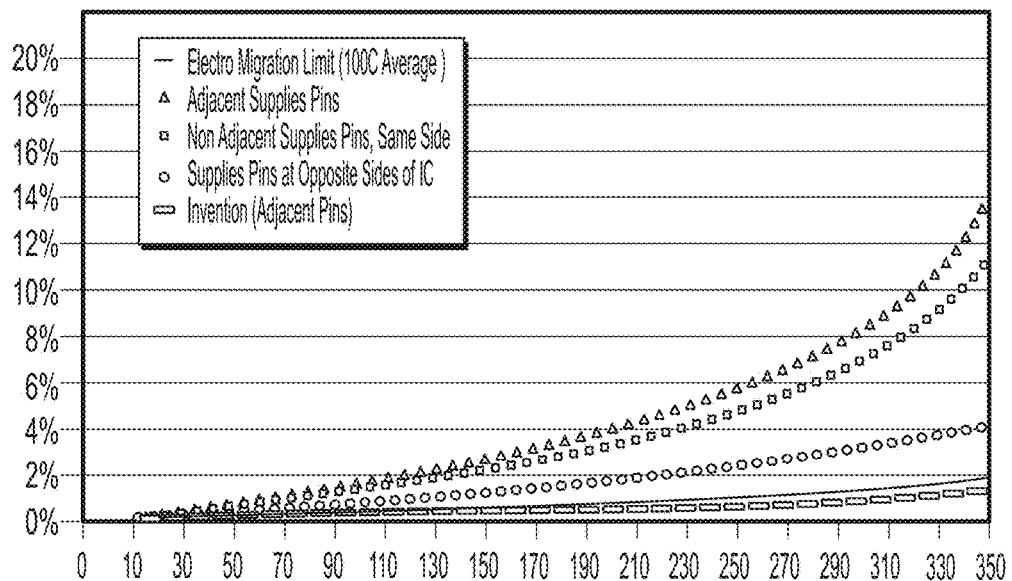
FIG. 7 is a graph showing a power metallization area at a frequency of 40 MHz.
Figure 8:
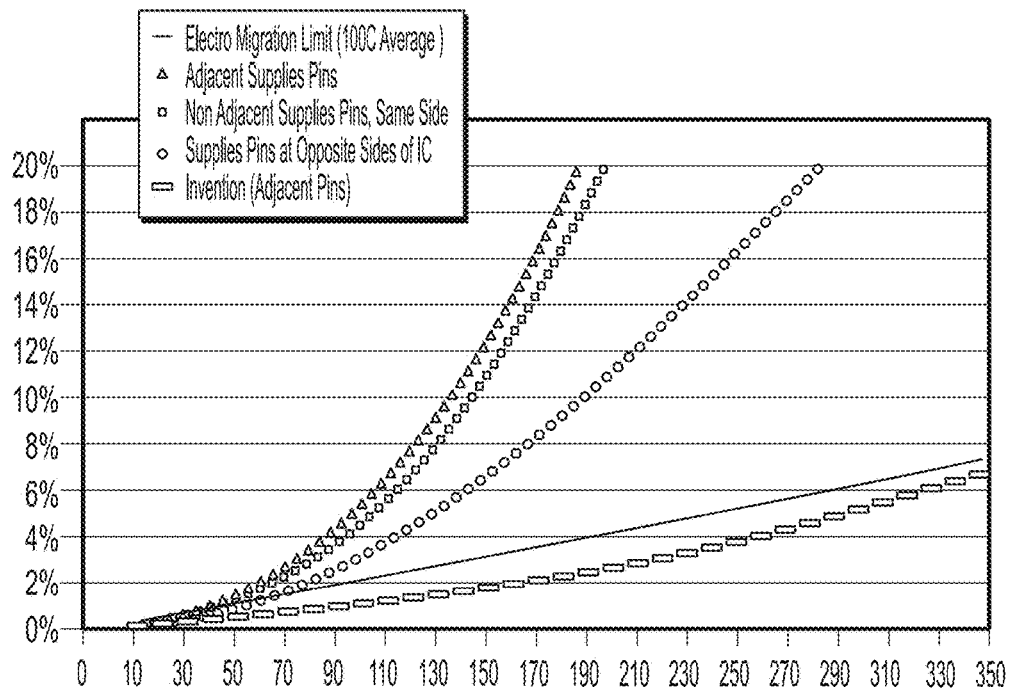
FIG. 8 is a graph showing a power metallization area at a frequency of 100 MHz.

Referring to FIGS. 6-8, the design principles disclosed in this document is compared with other topologies based on the ratio needed for power rails area towards the powered digital block area versus the digital size in thousands of gates is illustrated. In FIGS. 6-8, a system using the principles disclosed herein is illustrated using the data series labeled "Invention (Adjacent Pins)." The solid line in FIGS. 6-8 represents a limit of metal density imposed by design rules intended to prevent electromigration of the metal during operation. This limit reflects the physical process technology limit of the semiconductor process used to create the metallization. As illustrated, in FIGS. 6-8, the circuit design employing a voltage regulation system like that disclosed in this document requires functionally less area than the electromigration limit even in the less favorable adjacent bias pins configuration. This means that the design is now process technology limited (process technology reliability) rather than design layout limited. In each case shown, the area is displayed for its most favorable digital block aspect ratio (between about 0.5 and about 4). All the systems illustrated have gates with differential supplies between 1.96 V and 1.62 V while the power supply is 3.5 V. The temperature is 150 C and 4 metal layers were assumed in the configuration as depicted in FIG. 1 The implementation employing the principles disclosed herein labeled "Invention (Adjacent Pins)" has the lowest additional power metallization area of any of the solutions in the chart and enables designs below the electromigration limit. Referring to FIG. 1, the frequency is 20 MHz. Referring to FIG. 7, the frequency is 40 MHz. Referring to FIG. 8, the frequency is 100 MHz.

In various implementations, the plurality of transistors may be arranged in source follower configuration. In other implementations, the plurality of transistors may be arranged in an emitter follower configuration. In various implementations, the plurality of transistors may be arranged in a current mirror configuration. In various implementations, the plurality of transistors may have their sources all shorted together. In various implementations, the gate voltage of each transistor may be individually set, or each transistor may have the same gate voltage applied. In various implementations, each transistor used in a power domain rail may have substantially the same electrical properties; in others, each transistor may differ from each other transistor in electrical properties, or various groups of transistors may share the same properties.

The plurality of transistors may include metal oxide semiconductor field effect transistors (MOSFETs). The MOSFETs may have a load capacity that is large in comparison to the power domain rail load. As a result, the saturation voltage signal for the MOSFETs may be small and the variation of it with the power domain rail load variations may be negligible. By non-limiting example, the power domain rail load may be one of a VDD power domain rail or a VSS power domain rail.

Key benefits of the implementations of on-chip voltage regulators as described herein may include reduced area for the voltage regulator when compared with alternative solutions. By non-limiting example, the area used by one regulator as described herein may be smaller compared to techniques that utilize multiple regulators on a chip. The voltage gradients may also be reduced. The power and ground tracks may be patterned more narrowly than in other solutions because it is possible to have large voltage drops across the tracks. The dowered domain may be standard sized digital columns.

There may be less stability issues with implementations of voltage regulators as described herein. Regulator stability may be verifiable by classical techniques where there are no nested loop problems as in multiple regulators technique. In various implementations, the regulation feedback may not be needed what makes the stability unconditional because the power domain may be defined by very large source followers without sacrificing area on the IC. A small saturation voltage (MOSFET transistor case) may enable voltage followers without a regulation loop because the saturation voltage variations with the load current are small in comparison to the electrical load bias voltage accuracy requirement. In particular implementations, the regulator transistors may be laid out below the power and ground tracks. In a classical design when no dedicated metal layers are used, the area below the tracks is lost and the output stage consumes extra area in the IC.

Further advantages may include, fast design because the internal regulator topology is independent of load. Implementations of on-chip regulators as described herein may also decrease overshoot at load release when unregulated. Thermal dissipation spreading as described in implementations of on-chip voltage regulators may allow the dissipation of the power within the IC instead of outside of the IC. The dissipations of power within the IC may reduce the need for external regulators, IC pins, and exposed pads in the packages.

Power supply transistors systems as described herein may have a wide range of applicability. By non-limiting example, these systems may be used in any IC with an integrated regulator with the most benefit seen with high consumption or low electrical load voltage compared to the IC power supply. In some implementations, low voltage is described as 3.3 V and below. Implementations of this systems may also be useful in mixed mode design because of the coexistence of different power domains. Other implementations may also be useful in the automotive and safety industry because of requirement for the IC to remain functional in overvoltage conditions.

In places where the description above refers to particular implementations of power supply systems and implementing components, sub-components, methods and sub-methods, it should be readily apparent that a number of modifications may be made without departing from the spirit thereof and that these implementations, implementing components, sub-components, methods and sub-methods may be applied to other power supply systems.

What is claimed is:

1. An on-chip electrical regulation system comprising:
a positive power domain electrically coupled with a negative power domain through a power mesh comprising two or more loads;
wherein the positive power domain, the negative power domain, or both the positive power domain and the negative power domain comprise a power domain rail comprising a plurality of resistors distributed along a length of the power domain rail, the distributed plurality of resistors electrically coupled directly with a plurality of transistors also distributed along the length of the power domain rail;
wherein each of the plurality of transistors, in combination with the distributed plurality of resistors, are configured to dissipate an electrical power along the length of the power domain rail to reduce a voltage across the positive power domain, the negative power domain, or both the positive power domain and the negative power domain to a desired operating voltage at the power mesh;
wherein the power mesh comprises a plurality of interdigitated metal tracks electrically coupled with the two or more loads; and
wherein the plurality of transistors are comprised on the plurality of interdigitated metal tracks.

2. The system of claim 1, wherein one of the positive power domain, the negative power domain, and both the positive power domain and the negative power domain comprise a single trace.

3. The system of claim 1, wherein the plurality of transistors are connected in a source follower configuration and an emitter follower configuration.

4. The system of claim 1, wherein the two or more loads are transistors, digital gates, analog circuits, or any combination thereof.

5. The system of claim 1, wherein a gate voltage or a base voltage of each of the plurality of transistors is used in reducing a voltage received by each of the plurality of transistors from the power domain rail to the desired operating voltage.

6. The system of claim 1, wherein the plurality of transistors, in combination with the plurality of resistors, is configured to generate, using open loop control, a substantially constant voltage drop across each of the two or more loads of the power mesh across the length of the power domain rail.

7. An on-chip electrical regulation system comprising:
a positive power domain electrically coupled with a negative power domain through a power mesh comprising two or more loads;
wherein the positive power domain, the negative power domain, or both the positive power domain and the negative power domain comprise a power domain rail comprising a plurality of resistors distributed along a length of the power domain rail, the distributed plurality of resistors electrically coupled directly with a plurality of transistors also distributed along the length of the power domain rail;
wherein each of the plurality of transistors, in combination with the distributed plurality of resistors, are configured to generate using open loop control a substantially constant voltage drop across the two or more loads of the power mesh across the length of the power domain rail;
wherein the power mesh comprises a plurality of interdigitated metal tracks electrically coupled with the two or more loads; and
wherein the plurality of transistors are comprised on the plurality of interdigitated metal tracks.

8. The system of claim 7, wherein the plurality of transistors are connected in a source follower configuration or an emitter follower configuration.

9. The system of claim 7, wherein the positive power domain, the negative power domain, or both the positive power domain and the negative power domain comprise a single trace.

10. The system of claim 7, wherein a gate voltage or a base voltage of each of the plurality of transistors is used in reducing a voltage received by each transistor from the power domain rail to the desired operating voltage.

11. The system of claim 7, wherein the two or more loads are transistors, digital gates, analog circuits, or any combination thereof.

* * * * *